(12) United States Patent
Jung

(10) Patent No.: US 6,185,132 B1
(45) Date of Patent: Feb. 6, 2001

(54) SENSING CURRENT REDUCTION DEVICE FOR SEMICONDUCTOR MEMORY DEVICE AND METHOD THEREFOR

(75) Inventor: In Chul Jung, Seoul (KR)

(73) Assignee: Hyundai Electronics Industries Co., Ltd., Ichon-shi (KR)

( * ) Notice: Under 35 U.S.C. 154(b), the term of this patent shall be extended for 0 days.

(21) Appl. No.: 09/475,017

(22) Filed: Dec. 30, 1999

(30) Foreign Application Priority Data

Dec. 30, 1998  (KR) .................................................. 98-61967

(51) Int. Cl.$^7$ ....................................................... G11C 7/00
(52) U.S. Cl. ................................ 365/185.21; 365/189.11; 365/205
(58) Field of Search ............................... 365/205, 189.11, 365/185.21

(56) References Cited

U.S. PATENT DOCUMENTS

| | | |
|---|---|---|
| Re. 36,180 | 4/1999 | Lim . |
| 4,670,675 | 6/1987 | Donoghue . |
| 5,122,986 | * 6/1992 | Lim .................................. 365/189.11 |
| 5,163,022 | 11/1992 | Homma et al. . |
| 5,563,842 | 10/1996 | Yamada et al. . |
| 5,949,729 | 9/1999 | Suyama et al. . |

* cited by examiner

*Primary Examiner*—Terrell W. Fears
(74) *Attorney, Agent, or Firm*—Jacobson, Price, Holman & Stern, PLLC

(57) ABSTRACT

The present invention relates to a sensing current reduction device for a semiconductor memory device, and a method therefor, which can considerably reduce a sensing current occupying a great part of an operating current and consume less power, by controlling a bit line sense amplifier to be operated after receiving a column address, and control a long-time operation not to be carried out after applying the row address. Accordingly, a time from latching a row address signal to receiving a column address signal is sharply decreased. As a result, an access time is reduced, thus achieving the high speed operation.

9 Claims, 3 Drawing Sheets

SENSING CURRENT REDUCTION DEVICE FOR SEMICONDUCTOR MEMORY DEVICE AND METHOD THEREFOR

BACKGROUND OF THE INVENTION

1. Field of the Invention

The present invention relates to a sensing current reduction device for a semiconductor memory device, and a method therefor, and in particular to an improved sensing current reduction device for a semiconductor memory device which can reduce a sensing current occupying a great part of an operating current and consume less power, by controlling a bit line sense amplifier to be operated after receiving a column address, and a method therefor.

2. Description of the Background Art

In general, a dynamic random access memory (DRAM) consumes much power, as compared with other memory devices, such as a static random access memory (SRAM). It is because the DRAM cell must perform a refresh operation.

That is, as the time elapses, data stored in a capacitor constituting the memory cell are lost with a leakage current. Accordingly, a process for sensing and restoring the data is necessary before the data are lost. In addition to the refresh operation, mostly in the DRAM operation, word lines of the memory cells more than those storing the externally-required data are enabled, thereby performing a sensing operation.

As described above, the sensing operation of the memory cells is not necessary, except for a pull-page operation. All the memory cells are written again according to a refresh command before the data are lost. Therefore, in a general read operation, if the data of the memory cell did not required, the sensing operation about the memory cell is consumptive.

Accordingly, in order to reduce the current consumption, it is essential to minimize the number of the cells wherein the word lines are opened and the sensing operation is necessary in a row active operation.

For example, the case that the number of the cells is 64M ($64 \times 1024 \times 102 = 2^{26}$) will now be explained.

In this case, addresses of 26 bits are necessary in order to select one of the cells. However, most of the DRAM devices which have been manufactured and distributed input/output four, eight or sixteen data at the same time, instead of inputting/outputting the data one by one. Thus, it is not necessary to divide the addresses of the data groups (four, eight and sixteen). As a result, addresses of smaller bits than 26 bits are required. When the products are named x4, x8 and x16 products, respectively, the 64M(x4) product needs addresses of 24 bits, the 64M(x8) product needs addresses of 23 bits, and the 64M(x16) product needs addresses of 22 bits.

A conventional method for the DRAM device to receive the addresses inside will now be described.

The DRAM device does not receive the addresses at one time. That is, the DRAM device receives the addresses inside according to an address multiplexing method, which has been designated as the Specification in the relational field.

So long as a completely new DRAM device is not developed and deemed to have applicability, and the Specification is separately designated, all the DRAM devices generally employ the address multiplexing method.

The address multiplexing method is to receive the addresses for selecting the cell in twice. Here, only a half of address pins are required, as compared with other methods which do not use the address multiplexing method.

Accordingly, the address multiplexing method has many advantages in that the number of pins and pads reduces, and that the number of circuits such as an input buffer also decreases.

The address which is firstly inputted in the address multiplexing is called a row address. The word line is selected by utilizing the row address, and a bit line sense amplifier is operated, waiting for a column address which will be a second address.

However, once the word line is selected and opened, electric charges (indicating the data of '1' and '0') stored in the cell flow into bit lines BL, /BL, and thus the a charge sharing is performed. Accordingly, it is required to sensing and restoring the data before closing the word line. As a result, the sensing operation is necessary.

Therefore, the number of the cells opened by the word line is determined by the number of the row addresses which are firstly inputted. After finishing the aforementioned step, the column address signal which is the second address is inputted. Thus, the group of the cells (four, eight and sixteen) sensed after enabling the word line can be selected by decoding the column address.

As known from the above-described address multiplexing method, in order to reduce the current consumption, a smaller number of word lines must be enabled, and thus a smaller number of cells must be opened and sensed. The limit is determined by the number of the row addresses. It cannot be overcome according to the method for opening the cell by enabling the word line before receiving the column address.

That is to say, in the case that the cells are opened fewer than the cells which can be opened by the row addresses according to the aforementioned limit, when the necessary cell is selected by using a succeeding column address signal, the cell which is not opened may be selected.

In this regard, the 64M DRAM product will now be exemplified.

According to the Spec., the 64M DRAM product must be provided with fourteen address pins A0–A13. In addition, in the case of the 64M(x4) DRAM, the number of the cells to be selected is $2^{24}$. When it is presumed that the row address signals inputted at an initial stage are maximally 14 bits ax0~ax13, if $2^{14}$ cells are selected by using the row address signals of 14 bits, the number of the cells which are not selected is $2^{10}$. In the case of the x4 product, $2^{12}$, namely 4k cells remain.

That is, $2^{14}$ cells are firstly selected among the whole 64M cells by the row address signals of 14 bits firstly inputted according to the address multiplexing method, and the residual 4k cells wait for being selected by column address signals of 10 bits ay0~ay9. Here, the state of waiting for selection implies a state where the 4k cells are opened by the word lines and sensed by the bit line sense amplifier.

In case the DRAM is designed so that the cells fewer than 4k can wait for being selected by the column address, as described above, when a specific column address is selected, the cell may not be opened. In this case, the data of the cell cannot be read or write.

Accordingly, the 4k cells must be opened in the 64M (x4) DRAM product.

That is, when it is presumed that the number of the cells to be selected is $2^n$, and the number of the address pins available is $2^m$, in accordance with the method for opening the cell by enabling the word line before receiving the column address signal, at least $2^{n-m}$ cells must be sensed. As a result, the sensing current occupying a most part of an operating current in the DRAM operation is much consumed, thereby increasing the current consumption of the whole device.

SUMMARY OF THE INVENTION

Accordingly, it is an object of the present invention to provide a sensing current reduction device for a semiconductor memory device that can considerably reduce a sensing current occupying a great part of an operating current in a DRAM operation, and consume less power, and a method therefor.

In order to achieve the above-described object of the present invention, there is provided a sensing current reduction device for a semiconductor memory device, including: a memory cell array consisting of a plurality of sub-cell arrays; a first decoder unit for decoding a plurality of row address signals, and outputting a global word line selection signal; a second decoder unit for decoding a plurality of column address signals, and outputting a global column line selection signal; a selection unit for receiving the plurality of row address signals and the plurality of column address signals, and outputting a sub-cell array selection signal in order to select one of the plurality of sub-cell arrays; a third decoder unit for outputting a signal enabling the sub-cell array according to the sub-cell array selection signal and the global word line selection signal; and a sense amplifier unit for sensing/amplifying and outputting a data according to the sub-cell array selection signal and the global column line selection signal.

In addition, there is provided a sensing current reduction method for a semiconductor memory device, including the steps of: outputting a global word line selection signal through a plurality of row address signals; outputting a global column line selection signal through a plurality of column address signals; outputting a selection signal enabling one of a plurality of sub-cell arrays of a memory cell array through the plurality of row address signals and the plurality of column address signals, and simultaneously outputting a signal for operating a sense amplifier unit by delaying the selection signal for a predetermined time; and externally outputting the data by the sense amplifier unit according to the global column line selection signal.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A sensing current reduction device for a semiconductor memory device and a method therefor in accordance with a preferred embodiment of the present invention will now be described in detail with reference to the accompanying drawings.

Figure 1:
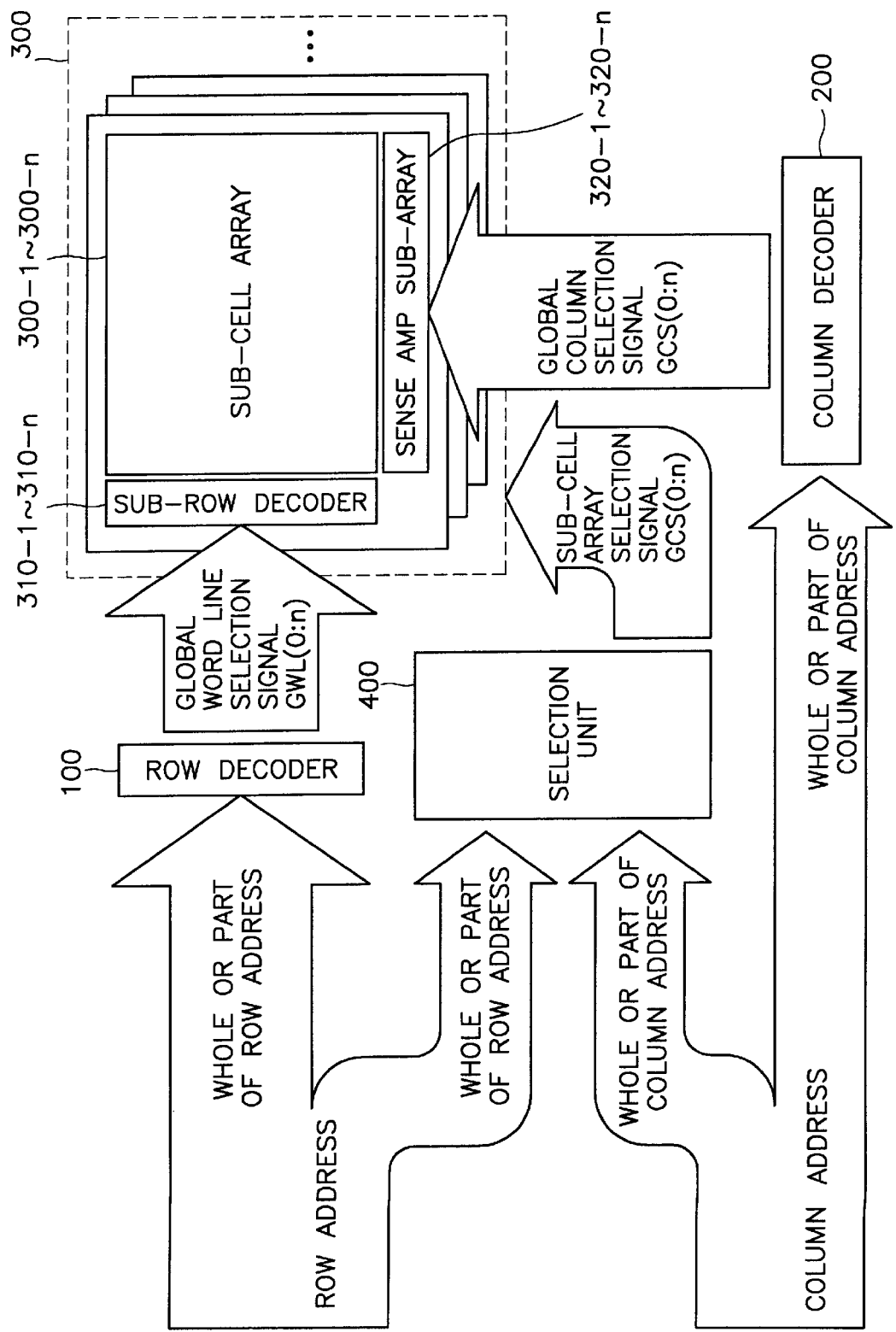
FIG. 1 is a schematic block diagram illustrating a sensing current reduction device for a semiconductor memory device in accordance with the present invention.

FIG. 1 is a schematic block diagram illustrating the sensing current reduction device for the semiconductor memory device in accordance with the present invention. As shown therein, the sensing current reduction device includes: a row decoder 100 for wholly or partially receiving and decoding row address signals from an external chip-set, and generating global word line selection signals GWL<0>~GWL<n>; a column decoder 200 for wholly or partially receiving and decoding column address signals from the external chip-set, and generating global column selection signals GCS<0>~GCS<n>; a memory cell array 300 consisting of a plurality of sub-cell arrays 300-1~300-n; and a selection unit 400 for receiving the row address signals and the column address signals, and generating sub-cell array selection signals SCAS<0>~SCAS<n> selecting one of the plurality of sub-cell arrays 300-1~300-n according to a combination thereof.

In addition, each of the plurality of sub-cell arrays 300-1~300-n includes: sub-row decoders 310-1~310-n enabled according to the sub-cell array selection signals SCAS<0>~SCAS<n> generated from the selection unit 400; and sense amplifier sub-arrays 320-1~320-n enabled according to the sub-cell array selection signals SCAS<0>~SCAS<n> or delay and deformation signals thereof.

Figure 2:
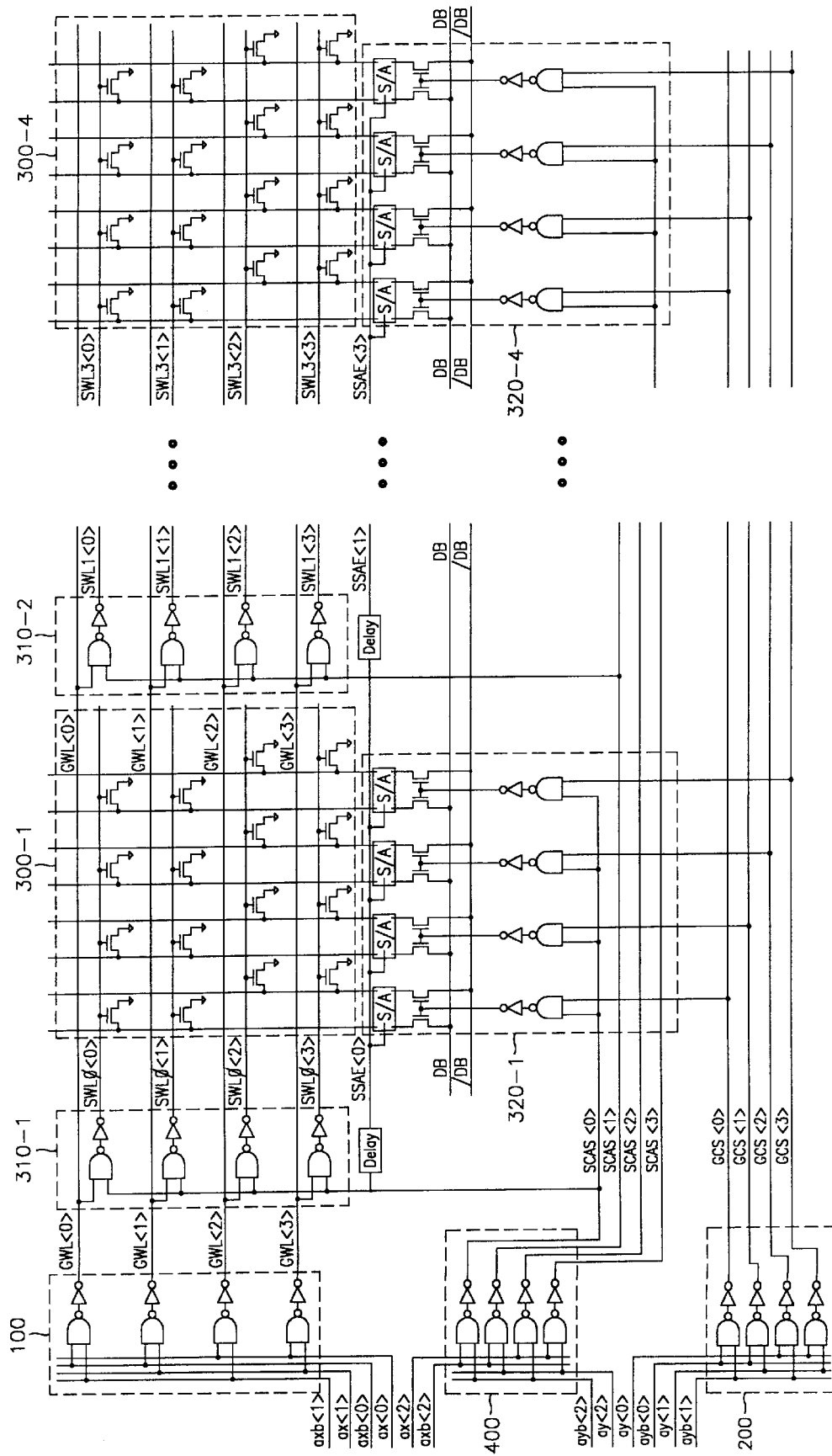
FIG. 2 is a detailed circuit diagram illustrating the sensing current reduction device for the semiconductor memory device as shown in FIG. 1.

FIG. 2 is a detailed circuit diagram illustrating the sensing current reduction device for the semiconductor memory device as shown in FIG. 1. As shown therein, the global word line selection signals GWL<0>~GWL<3>, the global column selection signals GCS<0>~GCS<3> and the sub-cell array selection signals SCAS<0>~SCAS<3> are generated according to an appropriate combination of the row addresses ax<0:2<, /ax<0:2< and the column addresses ay<0:2>, /ay<0:2> applied in order to selectively enable the four sub-cell arrays 300-1~300-4.

The row decoder 100 comprises NAND gates respectively receiving four combination states of ax<0:1>, /<ax0:1> which become a part of the row address; and inverters respectively connected to output terminals of the NAND gates. The four global word line selection signals GWL<0>~GWL<3> are respectively generated through the output terminals of the inverters.

The column decoder 200 has an identical constitution to the row decoder 100 (serial structure of NAND gates respectively receiving four combination states of the inputted column address signals; and inverters). The column decoder 200 receives ay<0:1>, /ay<0:1> which become a part of the column address from the external chip-set, and generates the four global column selection signals GCS<0>~GCS<3>.

In addition, the sub-cell array selection unit 400 comprises NAND gates respectively receiving four combination states of ax<2> and /ax<2> which become a part of the row address, and ay<2> and /ay<2> which become a part of the column address; and inverters respectively connected to output terminals of the NAND gates.

Figure 3:
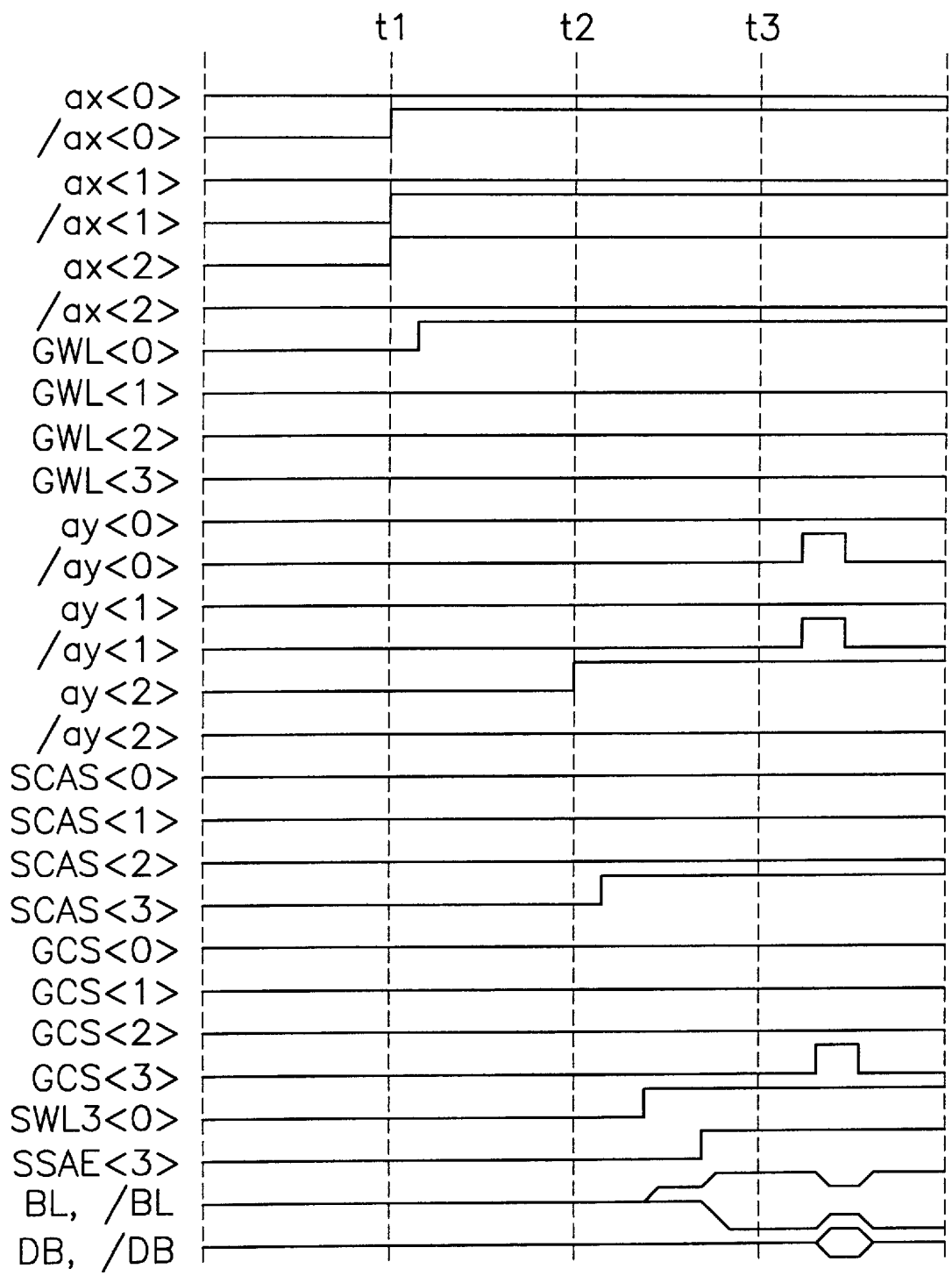
FIG. 3 is an operational timing diagram of the sensing current reduction device for the semiconductor memory device as shown in FIG. 2.

FIG. 3 is an operational timing diagram of the sensing current reduction device for the semiconductor memory device as shown in FIG. 2. The sensing current reduction device for the semiconductor memory device and the method therefor in accordance with the present invention will now be described in detail with reference to FIG. 3.

Firstly, in x-addresses ax<0:2>, /ax<0:2>, six signals are all at a low level until a row active command is externally inputted (before the point t1). When the row active command is inputted, the six signals are varied conversely to a potential level, and latched according to the row address.

On the other hand, in y-addresses ay<0:2>, /ay<0:2>, six signals are all at a low level until a column active command is externally inputted (before the point t2). When the column active command is inputted, ay<2> and /ay<2> are varied conversely to a potential level according to the second column address.

In ay<0:1> and /ay<0:1>, when the input address is at a high level according to the 0th and first column addresses, a high pulse is generated to ay<0:1>, and /ay<0:1> constantly maintains a low level potential. Conversely, when the input address is at a low level, ay<0:1> constantly maintains a low level, and a high pulse is generated to /ay<0:1>.

At this time, the timing is controlled so that the pulse signals ay<0:1>, /ay<0:1> can be generated after completely finishing the sensing operation (after the point t3).

In this state, the row decoder 100 receives ax<0:1> and /ax<0:1> which become a part of the row address, and generates the global word line selection signals GWL<0>~GWL<3>. The sub-cell array selection unit 400 receives ax<2> and /ax<2> as a part of the row address, and ay<2> and /<ay2> as a part of the column address, and decodes the signals, thereby generating the four sub-cell array selection signals SCAS<0>~SCAS<3>.

Here, the sub-row decoder 310-1~310-4 enables a sub-word line (SWL 3 in the drawing) corresponding to the global word line in one sub-cell array selected according to a potential level of the four sub-cell array selection signals SCAS<0>~SCAS<3>. At the same time, only in the selected sub-cell array, a sub-sense amplifier enable signal SSAE<3> is enabled, thereby operating a corresponding sense amplifier.

On the other hand, the column decoder 200 receives ay<0:1> and /ay<0:1> as a part of the column address, and generates the global column selection signal GCS<0:3>. When the global column selection signal GCS<0>~GCS<3> is generated, the data sensed by the bit line sense amplifier is applied to data bus lines DB, /DB, and externally outputted from the chip.

The sensing current reduction device for the semiconductor memory device and the method therefor will now be described in detail by exemplifying the DRAM.

Firstly, the row active command signal (combination of signals /RAS, /CAS, /WE) and the row address signal are inputted from the external chip-set, decoded, and latched at a proper position (for example, a position near the cell, such as a main row decoder and a main column decoder) (Step 1).

In addition, the read or write command signal (combination of signals /RAS, /CAS, /WE) and the column address signal are externally inputted, decoded in the DRAM chip, and transmitted to a position near the cell (core area) (Step 2). In the case of the write command, the input data to be written on the cell is inputted together, and transmitted to the position near the cell (core area).

Thereafter, when the column address signal reaches into the core area, a preferred number of the word lines are enabled by using the row address stored in Step 1, thereby generating the selection signal in order to select a part of the plurality of sub-cell arrays composing the memory cell array, namely the wanted sub-cell array (Step 3).

The sub-cell array selected by the above step is enabled, and thus the bit line sense amplifier is operated after a predetermined delay time (the time for finishing a charge sharing) (Step 4).

When the sensing operation of the bit line sense amplifier is finished, the data is applied to the data bus line by using the output signal from the column decoder, and the data on the data bus line is externally outputted after a processing step in the DRAM chip (Step 5).

As described above, the sensing current reduction device for the semiconductor memory device and the method therefor in accordance with the present invention control the bit line sense amplifier to be operated after receiving the column address, thereby remarkably reducing the sensing current occupying the great part of the current required during the DRAM operation.

In addition, the sensing current reduction method for the semiconductor memory device in accordance with the present invention can be applied to an extended data DRAM (E.D.O DRAM) and a synchronous DRAM as well as the DRAM device.

In the case of the synchronous DRAM, when receiving the row address signal and the column address signal, or when externally outputting the data after the data sensing operation in the memory cell, the synchronous DRAM is controlled to be synchronized with a system clock.

As discussed earlier, the sensing current reduction device for the semiconductor memory device and the method therefor in accordance with the present invention control the bit line sense amp to be operated after receiving the column address, thereby remarkably reducing the sensing current occupying the most of the current required during the DRAM operation. As a result, the operating current of the whole device considerably decreases.

Furthermore, a long-time operation is not carried out after applying the row address, and thus a time interval tRCD from latching the row address signal to receiving the column address signal is sharply decreased. Accordingly, an access time is reduced, thus achieving the high speed operation.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A sensing current reduction device for a semiconductor memory device, comprising:
   a memory cell array consisting of a plurality of sub-cell arrays;
   a first decoder means for decoding a plurality of row address signals, and outputting a global word line selection signal;
   a second decoder means for decoding a plurality of column address signals, and outputting a global column line selection signal;
   a selection means for receiving the plurality of row address signals and the plurality of column address signals, and outputting a sub-cell array selection signal in order to select one of the plurality of sub-cell arrays;
   a third decoder means for outputting a signal enabling the sub-cell array according to the sub-cell array selection signal and the global word line selection signal; and
   a sense amplifier means for sensing/amplifying and outputting a data according to the sub-cell array selection signal and the global column line selection signal.

2. The device according to claim 1, wherein a timing of the global column line selection signal is set to be generated after a sensing operation.

3. The device according to claim 1, wherein the sense amplifier means comprises a delay unit for delaying the sub-cell array selection signal for a predetermined delay time, and outputting a signal for operation of the sense amplifier.

4. The device according to claim 1, wherein the row address signals are signals varied to an opposite level, latched and outputted, when a row active command is inputted.

5. The device according to claim 1, wherein a delay time required in the operation of the sense amplifier means is a time from opening the sub-cell to finishing a charge sharing.

6. A sensing current reduction method for a semiconductor memory device, comprising the steps of:
   - outputting a global word line selection signal through a plurality of row address signals;
   - outputting a global column line selection signal through a plurality of column address signals;
   - outputting a selection signal enabling one of a plurality of sub-cell arrays of a memory cell array through the plurality of row address signals and the plurality of column address signals, and simultaneously outputting a signal operating a sense amplifier means by delaying the selection signal for a predetermined time; and
   - externally outputting the data by the sense amplifier means according to the global column line selection signal.

7. The method according to claim 6, wherein a delay time required in the operation of the sense amplifier menas is a time from opening an enabled sub-cell to finishing a charge sharing.

8. The method according to claim 6, wherein a timing of the global column line selection signal is set to be generated after a sensing operation.

9. The method according to claim 6, wherein the row address signals are signals varied to an opposite level, latched and outputted, when a row active command is inputted.

* * * * *